United States Patent
Choy et al.

(10) Patent No.: US 7,428,172 B2
(45) Date of Patent: Sep. 23, 2008

(54) CONCURRENT PROGRAMMING AND PROGRAM VERIFICATION OF FLOATING GATE TRANSISTOR

(75) Inventors: Jon S. Choy, Austin, TX (US); David W. Chrudimsky, Austin, TX (US); Thomas Jew, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 259 days.

(21) Appl. No.: 11/487,863

(22) Filed: Jul. 17, 2006

(65) Prior Publication Data

US 2008/0013384 A1    Jan. 17, 2008

(51) Int. Cl.
*G11C 11/34* (2006.01)
(52) U.S. Cl. .................. 365/185.22; 365/24
(58) Field of Classification Search ............ 365/185.22, 365/185.24, 185.14
See application file for complete search history.

(56) References Cited

U.S. PATENT DOCUMENTS

| | | | |
|---|---|---|---|
| 6,493,266 B1 * | 12/2002 | Yachareni et al. ...... | 365/185.22 |
| 6,646,950 B2 | 11/2003 | Akaogi | |
| 6,785,177 B2 | 8/2004 | Choy et al. | |
| 6,809,961 B2 | 10/2004 | Micheloni et al. | |
| 6,853,586 B2 | 2/2005 | Choy et al. | |
| 7,224,614 B1 * | 5/2007 | Chan ...................... | 365/185.22 |
| 7,251,160 B2 * | 7/2007 | Li et al. ................. | 365/185.03 |
| 7,313,649 B2 * | 12/2007 | Tomita et al. ............... | 711/103 |
| 2004/0218421 A1 | 11/2004 | Choy et al. | |

OTHER PUBLICATIONS

Makwana, Jitu J. et al.; "A Non-Volatile Memory Overview"; A.P. Lawrence; Oct. 2004; <http://aplawrence.com/Makwana/nonvolmem.html>.

* cited by examiner

*Primary Examiner*—Anh Phung (57) ABSTRACT

A program voltage is applied to the drain electrode of a floating gate transistor to program the floating gate transistor. Concurrent with the application of the program voltage, a current based on the voltage at the source electrode of the floating gate transistor is compared with a threshold current to verify the programming of the floating gate transistor. When the bit cell current falls below the threshold current, the floating gate transistor is considered to be sufficiently programmed and the next floating gate transistor to be programmed is selected. Further, the program voltage supply emulates the selection circuitry used to select between the bit cells so as to model the voltage drop caused by the selection circuitry between the program voltage supply and the drain electrode of the floating gate transistor being programmed. The program voltage supply adjusts the output program voltage based on the modeled voltage drop.

19 Claims, 4 Drawing Sheets

CONCURRENT PROGRAMMING AND PROGRAM VERIFICATION OF FLOATING GATE TRANSISTOR

FIELD OF THE DISCLOSURE

The present disclosure relates generally to non-volatile memory and more particularly to programming non-volatile memory employing floating gate transistors.

BACKGROUND

Non-volatile memories often employ floating gate transistors to form bit cells that reliably store data even in the absence of a supplied voltage. Typically, the value stored at each bit cell depends on the conductivity of the floating gate transistor of the bit cell. The conductivity of the floating gate transistor, when enabled by the control gate, depends on the charge stored at the floating gate. Accordingly, prior to programming, each floating gate transistor has a certain conductivity assigned to one bit value (e.g., logic 1). To program a floating gate transistor to the other bit value (e.g., logic 0), a hot carrier injection (HCI) technique is utilized to inject electrons into the floating gate. The HCI technique typically includes the application of program voltages at the drain electrode and the control gate of the floating gate transistor that are sufficient to drive electrons into the floating gate.

Conventional memories employ a reiterative, sequential program and verification process. In these memories, a program voltage is applied to the floating gate transistor for a predetermined duration. After the duration has elapsed, the bit cell is read to verify that it was programmed correctly. If the test read of the bit cell indicates that the programming was unsuccessful, another program voltage is applied to the bit cell for another predetermined duration and the bit cell then is read again after the lapse of the duration to verify proper programming. This cycle can be repeated a number of times until the test read verifies that the bit cell has been programmed correctly. The repeated application of the program and verify cycle often results in substantial time invested in programming the bit cells of a non-volatile memory.

Further, the selection circuitry used to select a bit cell for programming often results in a somewhat unpredictable voltage drop between the source of the program voltage and the electrodes (typically the drain junction) of the floating gate transistor being programmed. Due to this unpredictability, a lower program voltage often is used so as to avoid junction breakdown of the floating gate transistor due to the application of excessive program voltage to the floating gate transistor as the hot carrier injection current drops to zero. This use of a lower program voltage typically requires the application of the program voltage for a longer duration, which increases the total time needed to program the bit cells of the non-volatile memory.

In view of the foregoing, it will be appreciated that an improved technique for programming and verifying floating gate transistor-based bit cells would be advantageous.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

In accordance with one aspect of the present disclosure, a method includes applying a first program voltage to a drain electrode of a first floating gate transistor coupled to a first bit line of a non-volatile memory and determining a first current based on a voltage at a source electrode of the first floating gate transistor concurrent with the application of the first program voltage to the drain electrode of the first floating gate transistor. The method further includes terminating the application of the first program voltage to drain electrode of the first floating gate transistor in response to determining the first current to be less than a threshold current.

In accordance with another aspect of the present disclosure, a method is provided for non-volatile memory including a first bit line coupled to a drain electrode of a first floating gate transistor and a second bit line coupled to a drain electrode of a second floating gate transistor. The method includes selecting the first bit line for programming and applying a first program voltage to the drain electrode of the first floating gate transistor until a first current based on a voltage of a source electrode of the first floating gate transistor is less than a threshold current. The method further includes selecting the second bit line for programming subsequent to applying the program voltage to the drain electrode of the first floating gate transistor and applying a second program voltage to the drain electrode of the second floating gate transistor until a second current based on a voltage of a source electrode of the second floating gate transistor is less than a second threshold current.

In accordance with an additional aspect of the present disclosure, a non-volatile memory includes a program voltage supply comprising an output to provide a program voltage, a bit cell array comprising a first bit line and a first floating gate transistor having a drain electrode coupled to the first bit line, and a program select module configured to couple the first bit line to the output of the program voltage supply in a first state and to decouple the first bit line from the output of the program voltage supply in a second state. The non-volatile memory further includes a program verify module comprising an input coupled to a source electrode of the first floating gate transistor and an output configured to adjust the program select module between the first state and the second state in response to a first current based on a voltage at the source electrode.

FIGS. 1-5 illustrate exemplary techniques for programming floating gate transistors used in bit cells of a non-volatile memory. In one embodiment, a program voltage is applied to the drain electrode of a floating gate transistor to program the floating gate transistor. Concurrent with the application of the program voltage, a current based on the voltage at the source electrode of the floating gate transistor is compared with a threshold current to verify the programming of the floating gate transistor. When the bit cell current falls below the threshold current, the floating gate transistor is considered to be sufficiently programmed and the next floating gate transistor to be programmed is selected. Further, in one embodiment, the program voltage supply emulates the selection circuitry used to select between the bit cells for programming so as to model the IR (current-resistance or voltage) drop caused by the selection circuitry between a source of the program voltage and the drain electrode of the floating gate transistor being programmed. The program voltage supply adjusts the output program voltage based on the modeling of the IR drop, thereby allowing a higher voltage to be used as the program voltage with less risk of a junction breakdown of the floating gate transistor being programmed.

Figure 1:
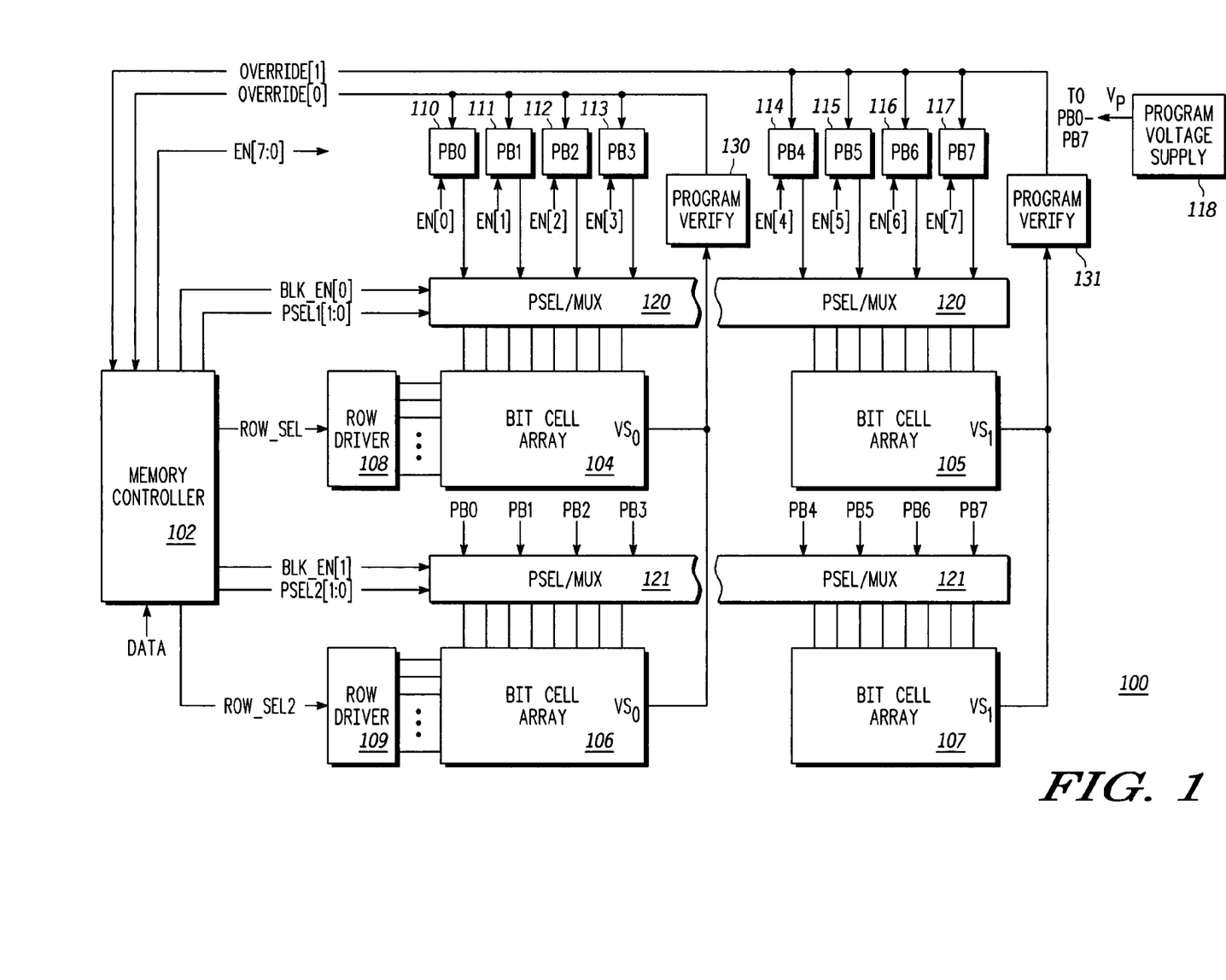
FIG. 1 is a block diagram illustrating an exemplary non-volatile memory in accordance with at least one embodiment of the present disclosure.

Referring to FIG. 1, an exemplary non-volatile memory 100 is illustrated in accordance with at least one embodiment of the present disclosure. The non-volatile memory 100 includes any of a variety of memory topologies which utilize HCI programming, including, but not limited to, floating gate topologies (e.g., flash memory), nanocrystal and thin-film storage devices. For ease of illustration, the non-volatile memory 100 is depicted as having two memory blocks (BLK0 and BLK1), each memory block having two bit cell arrays. It will be appreciated that the number of memory blocks and bit cell arrays typically will differ depending upon implementation. Accordingly, the non-volatile memory includes a memory controller 102, bit cell arrays 104-107, row drivers 108 and 109, program buffers 110-117 (also referred to as program drivers), program buffer select multiplexer (PSEL/MUX) 120 and PSEL/MUX 121, a program voltage supply 118, and program verify modules 130 and 131.

The bit cell array 104 and the bit cell array 105 are associated with BLK0 and bit cell array 106 and bit cell array 107 are associated with BLK1. The bit cell arrays 104-107 each include a matrix of bit cells represented by floating gate transistors (not shown) and accessible via a plurality of bit lines and a plurality of row lines, where a select one of the N rows of the bit cell array 104 or a select one of the N rows of the bit cell array 105 is driven by a row driver 108 based on an input signal ROWSEL1 and a select one of the N rows of the bit cell array 106 or a select one of the N rows of the bit cell array 107 is driven by a row driver 109 based on an input signal ROWSEL2. A particular implementation of a bit cell array is discussed in greater detail herein with reference to FIG. 2.

The program buffers 110-117 (also referred to as PB0-PB7) are used to program the floating gate transistors of the bit cell arrays 104-107. In the depicted example, four program buffers (program buffers 110-113) are used to program the bit cell arrays 104 and 106 and the remaining four program buffers (program buffers 114-117) are used to program the bit cell arrays 105 and 107. Each of the program buffers 110-117 includes an input to receive the program voltage $V_P$, an input to receive an enable signal EN[n], an input to receive an override signal (OVERRIDE[0] for program buffers 110-113 and OVERRIDE[1] for program buffers 114-117) and a program output that is asserted or unasserted responsive to the enable signal EN and the override signal.

In the illustrated example, the bit cell arrays 104-107 each include eight bit lines. Accordingly, the PSEL/MUX 120 and the PSEL/MUX 121 each includes a plurality of program inputs, each program input connected to the program outputs of a corresponding one of the program buffers 110-117, a block enable signal (BLK_EN[0] for PSEL/MUX 120 and BLK_EN[1] for PSEL/MUX 121) and an input to receive a program select signal (PSEL1[1:0] for PSEL/MUX 120 and PSEL2[1:0] for PSEL/MUX 121). The PSEL/MUX 120 and the PSEL/MUX 121 each also includes plurality of outputs, each output connected to a corresponding one of the bit lines of the bit cell arrays 104-107. The PSEL/MUX 120 multiplexes the four program buffers 110-113 between the eight bit lines of the bit cell array 104 and multiplexes the four program buffers 114-117 between the eight bit lines of the bit cell array 105 based on the program select signal PSEL1[1:0] when BLK_EN[0] is asserted. Likewise, the PSEL/MUX 121 multiplexes the program buffers 110-113 between the eight bit lines of the bit cell array 106 and multiplexes the four program buffers 114-117 between the eight bit lines of the bit cell array 107 based on the program select signal PSEL2[1:0] when BLK_EN[1] is asserted.

In the illustrated example, the source electrodes of the floating gate transistors of the bit cell array 104 and the bit cell array 106 are connected to a first common node and the source electrodes of the floating gate transistors of the bit cell array 105 and the bit cell array 107 are connected to a second common node. Accordingly, in one embodiment, the program verify module 130 includes an input connected to the source electrodes of the floating gate transistors of the bit cell array 104 and 106 and an output to provide the override signal OVERRIDE[0] responsive to the voltage $V_{S0}$ at the source electrode of the floating gate transistor being programmed. Likewise, the program verify module 131 includes an input connected to the source electrodes of the floating gate transistors of the bit cell array 105 and 107 and an output to provide the override signal OVERRIDE[1] responsive to the voltage $V_{S1}$ at the source electrode of the floating gate transistor being programmed.

The memory controller 102 includes an input to receive program data representative of the data to be programmed into the non-volatile memory 100. The memory controller 102 further includes inputs to receive the override signals OVERRIDE[0] and OVERRIDE[1] and includes outputs to provide: the signals BLK_EN[0] and PSEL1[1:0] to the PSEL/MUX 120; the signals BLK_EN[1], PSEL2[1:0] to the PSEL/MUX 121; the signals ROWSEL1 and ROWSEL2 to the row drivers 108 and 109, respectively; and the signals EN[0]-EN[7] to the program buffers 110-117, respectively.

During a write operation, a data value to be programmed into the non-volatile memory 100 is provided as the signal DATA to the memory controller 102. In response to the signal DATA, the memory controller 102 configures the elements of the non-volatile memory 100 in preparation for programming of the data value. This configuration includes selecting one of the two blocks for programming by asserting one of signals BLK_EN[0] and BLK_EN[1] and providing the corresponding value for PSEL[1:0] or PSEL[2:0] so as to configure the corresponding PSEL/MUX to enter a programming state whereby the output of the program voltage supply is connected to the corresponding bit line via the program buffers. The configuration further includes enabling one of the program buffers 110-113 and/or one of the program buffers 114-117 based on the data value, and providing the row information to the corresponding one of the row drivers 108 and 109.

After configuration, the programming of the floating gate transistor of a bit cell of one or more of the bit cell arrays 104 commences. The programming of the floating gate transistor is performed by hot carrier injection, which is implemented by providing the program voltage $V_P$ from a selected one of the program buffers to the drain electrode of the floating gate transistor. The hot carrier injection process further includes providing another program voltage to the gate electrode of the floating gate transistor via a select one of the row lines associated with the bit cell. As a result of the application of the program voltage $V_P$ to the drain electrode and the other program voltage to the gate electrode, electrons are injected into the floating gate of the floating gate transistor, thereby raising the effective threshold voltage of the and thus reducing the current flow between the drain electrode and the source electrode of the floating gate transistor.

It will be appreciated that the effective current flow of the floating gate transistor represents the logic value associated with the corresponding bit cell. Accordingly, to be effectively programmed, the hot carrier injection process ideally is applied at a sufficient voltage and for a sufficient duration so as to cause the current flow of the floating gate transistor to fall below a predetermined threshold. Conventional programming techniques typically employ a sequential program and verify technique wherein a program voltage is applied to a bit cell for a fixed duration and afterwards the bit cell is read to verify whether it was programmed correctly. If not, the program voltage is applied again for another duration and the bit cell is then checked again to verify the programming. However, this conventional technique often requires substantial time, thereby delaying the programming process. In contrast, the program verify modules 130 and 131, in one embodiment, each is configured to monitor a current generated from the voltage at the source electrode of the floating gate transistor as the program voltage $V_P$ is being applied. The monitored current is continuously compared to a reference current. When the monitored current falls below the reference current, the floating gate transistor is considered programmed and the corresponding program verify module asserts its override signal, thereby signaling that the programming of the bit cell is complete. In response to the assertion of the corresponding override signal, the selected program buffer terminates the application of the program voltage $V_P$. In this state the corresponding PSEL/MUX decouples the programming voltage from the corresponding bit line. Preparation for the programming of the next bit cell can commence.

It will be appreciated that the number of bits selected for programming during any given cycle typically is limited by the current output capability of the program voltage supply 118. Accordingly, a data value to be written to the non-volatile memory 100 may be programmed in a sequence of cycles, where a different set of bits of the data program are selected by the memory controller 102 for programming at each cycle. Thus, a bit cell of one of the bit cell arrays 104 and 106 may be programmed concurrently with a bit cell of one of the bit cell arrays 105 and 107. However, rather than configuring each of the set of program buffers 110-113 and the set of program buffers 114-117 to begin programming a corresponding bit from the next cycle immediately upon completion of the programming of the corresponding bit from the previous cycle, the memory controller 102, in one embodiment, delays configuring all of the program buffers 110-117 for the next cycle of programming until both override signals OVERRIDE[0] and OVERRIDE[1] are asserted, thereby indicating that all of the programming for the current phase is completed.

In many instances, the circuitry of the PSEL/MUX 120 and the PSEL/MUX 121 causes a voltage drop between the program voltage $V_P$ output by the program voltage supply 118 and the actual voltage applied to the drain electrode of the floating gate transistor being programmed. In conventional systems, this voltage drop prevents the application of a high program voltage in an effort to prevent the application of a program voltage that exceeds the junction breakdown voltage of the floating gate transistor. However, the program voltage supply 118, in one embodiment, includes circuitry that emulates the parasitic voltage (IR) drop caused by the PSEL/MUX 120 or PSEL/MUX 121 between the source of the program voltage and the bit line, thereby allowing the targeted program voltage to reach the drain electrode of the floating gate transistor being programmed. However, without sufficient monitoring, the program voltage $V_P$ may exceed the junction breakdown voltage of the floating gate transistor and will be applied to the drain electrode as the current drops to zero, thereby causing a junction breakdown at the floating gate transistor. Accordingly, in one embodiment, the emulation of the parasitic IR drop and the monitoring of the current at the floating gate transistor as performed by the program verify modules 130 and 131 reduces or eliminates the likelihood of a junction breakdown at the floating gate transistor being programmed.

Figure 2:
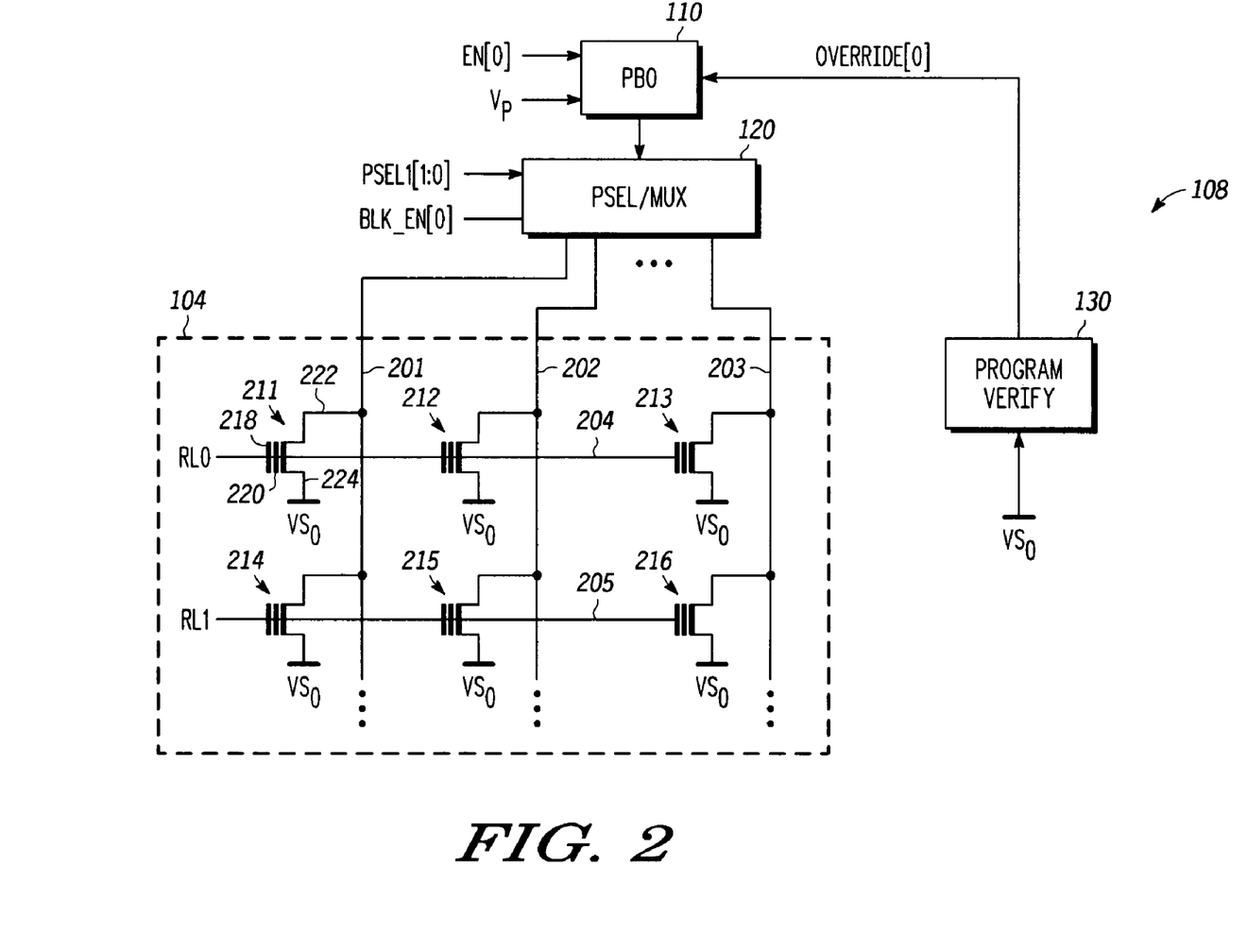
FIG. 2 is a diagram illustrating the non-volatile memory of FIG. 1 in greater detail in accordance with at least one embodiment of the present disclosure.

Referring to FIG. 2, the PSEL/MUX 120, the program verify module 130 and the bit cell array 104 of FIG. 1 are illustrated in greater detail in accordance with at least one embodiment of the present disclosure. The PSEL/MUX 121, program verify module 131 and bit cell arrays 105-107 of FIG. 1 are also are configured in the manner described with reference to FIG. 2.

In the depicted example, the bit cell array 104 includes a plurality of bit lines, including bit lines 201, 202 and 203, and a plurality of row lines, including row lines 204 and 205 (also referred to as RL0 and RL1, respectively). Each row line-bit line pairing is associated with a corresponding floating gate transistor that serves as the bit cell addressed by the particular combination of the row line and bit line. To illustrate, floating gate transistors 211, 212 and 213 serve as the bit cells accessed by row line 204 and read by bit lines 201, 202 and 203, respectively, and floating gate transistors 214, 215 and 216 serve as the bit cells accessed by row line 205 and read by bit lines 201, 202 and 203, respectively. Each floating gate transistor comprises a control gate 218, a floating gate 220, a drain electrode 222 connected to the corresponding bit line and a source electrode 224 connected to a first common node. The program verify module 130 includes an input connected the source electrodes 224 of the floating gate transistors of the bit cell array 104 so as to determine the voltage $V_{SO}$ at the source electrode 224 of the floating gate transistor being tested. The program verify module 130 includes an output to provide the override signal OVERRIDE[0] responsive to the voltage $V_{SO}$.

As discussed above, the PSEL/MUX 120 includes an input to receive the program output of one or more program buffers, such as the program buffer 110, and a plurality of outputs, each output connected to a corresponding bit line of the bit cell array 104. The program buffer 110 includes an input to receive the override signal OVERRIDE[0] from the program verify module 130, an input to receive the enable signal EN[0], an input to receive the program voltage $V_P$ and a program output to provide the program voltage $V_P$. As discussed above, the PSEL/MUX 120 is configured to provide the program voltage $V_P$ received at its input to a select one of the bit lines based on the state indicated by the program select signal PSEL1[1:0].

During a program operation, a bit line is supplied with the program voltage $V_P$ by the PSEL/MUX 120 and a program voltage $V_{WLP}$ is applied to one of the row lines by the row driver 108 (FIG. 1). As a result, the program voltage $V_P$ (less the parasitic IR drop caused by the program buffer 110 and the PSEL/MUX 120) is applied to the drain electrode 222 and the program voltage $V_{WLP}$ is applied to the control gate 218 of the floating gate transistor associated with the selected bit line and row line. Due to the application of these program voltages, electrons are driven to the floating gate of the transistor, thereby changing its threshold voltage ($V_t$) and thus its conductivity between the source electrode 224 and the drain electrode 222.

As the application of the program voltages proceeds, the program verify module 130, in one embodiment, compares a current $I_P$ generated from the voltage $V_{SO}$ at the source electrode 224 with a reference current $I_{REF}$. The reference current $I_{REF}$, in one embodiment, represents the expected current for current $I_P$ when the programming of the floating gate transistor has reached a sufficient level to represent a reliable state change. Thus, the current $I_P$ can represent the actual threshold voltage $V_{SO}$ of the floating gate transistor as it is being programmed and the reference current $I_{REF}$ can represent the expected threshold voltage $V_t$ of the floating gate transistor when it is sufficiently programmed. Accordingly, when the current $I_P$ falls below the reference current $I_{REF}$, the floating gate transistor is verified as programmed and the program verify module 130 asserts the override signal OVERRIDE[0] so that the program buffer 110 terminates the provision of the program voltage $V_P$ and further to indicate to the memory controller 102 (FIG. 1) that the bit cell of the bit cell array 104 has been programmed. In the event that the another bit cell on the same bit line is also to be programmed, the memory controller 102 resets the program verify module 130, enables the program buffer 110 (or another program buffer) and asserts the corresponding row line via the row driver 108 to initiate the programming of the next bit cell on the same bit line once all of the override signals are asserted. For the programming of a bit cell on another bit line, the memory controller 102 determines if the override signals from the other program verify modules have been asserted, and if so, then can select another bit line and bit cell for programming. The process of concurrent programming and verification of the floating gate transistors of a given bit line and then selecting the next bit line for programming continues until all bit cells of the bit cell array 104 identified for programming have been programmed.

Figure 3:
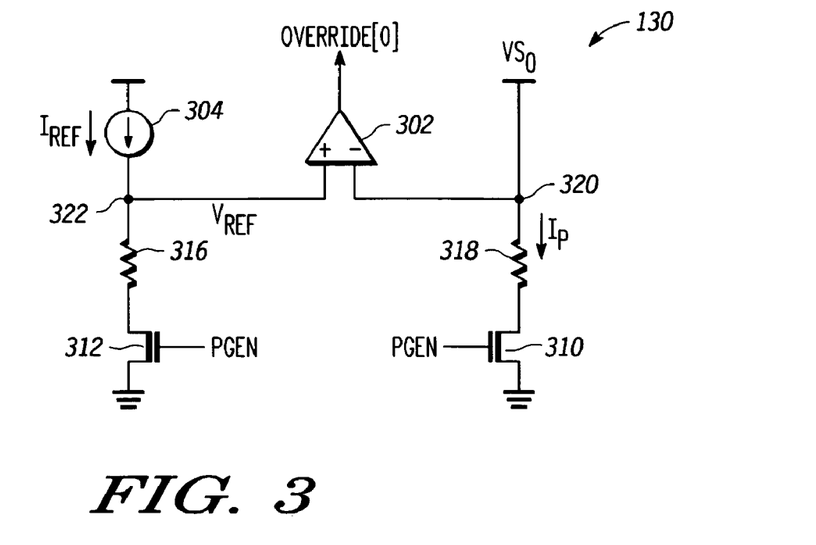
FIG. 3 is a diagram illustrating an exemplary program voltage supply of the program/verify system of FIG. 2 in accordance with at least one embodiment of the present disclosure.

Referring to FIG. 3, an exemplary circuit implementation of the program verify module 130 (FIG. 1) is illustrated in accordance with at least one embodiment of the present disclosure. As illustrated, the program verify module 130 includes an operational amplifier (op-amp) 302, a current reference 304, n-channel transistors 310 and 312, and resistors (resistive elements) 316 and 318. The resistor 318 includes a first electrode connected to a node 320, which is connected to the source electrodes 224 (FIG. 2) of the floating gate transistors, and a second electrode. The n-channel transistor 310 includes a first current electrode connected to the second electrode of the resistor 318, a second current electrode connected to a low voltage reference (e.g., ground), and a gate electrode to receive a PGEN signal, which is asserted during the programming of a bit cell. The resistor 316 includes a first electrode, connected to a node 322, and a second electrode. The n-channel transistor 312 includes gate electrode to receive the PGEN signal, a first current electrode connected to the second electrode of the resistor 316, and a second current electrode connected to the low voltage reference. The current source 304 includes an output connected to the node 322 to provide a reference current $I_{REF}$. The op-amp 302 includes a first signal input connected to the node 322, a second signal input connected to the node 320, and an output to provide the override signal OVERRIDE[0].

In operation, a voltage $V_{REF}$ is generated at node 322 as a result of the reference current $I_{REF}$ and the resistor 316. Similarly, the voltage $V_{SO}$ at the source electrode of the floating gate transistor being programmed generates the current $I_P$ between node 320 and the low-voltage reference via the resistor 318. It will be appreciated that as the floating gate transistor is programmed, its source-drain conductivity decreases, thereby causing the voltage $V_{SO}$ to decrease. This voltage decrease results in a decrease in the current $I_P$. Accordingly, in one embodiment, the circuitry of the program verify module 130 is configured so that the generated reference current $I_{REF}$ represents the threshold current for $I_P$ at which the floating gate transistor is considered sufficiently programmed. The op-amp 302 determines the relationship between the current $I_P$ and the reference current $I_{REF}$ (e.g., which current is greater than the other) based on a comparison of the voltages at nodes 320 and 322 generated by the current $I_P$ and the current $I_{REF}$, respectively. While the voltage at node 320 (resulting from the current $I_P$) is at or above the voltage at the node 322 (resulting from the reference current $I_{REF}$), the override signal OVERRIDE[0] remains unasserted by the op-amp 302. However, once the voltage at node 320 drops below the voltage at the node 322, indicating that the floating gate transistor has been sufficiently programmed, the op-amp 302 asserts the override signal OVERRIDE[0], thereby causing the termination of the application of the program voltage $V_P$ and indicating to the memory controller 102 (FIG. 1) that another bit is available for programming.

Figure 4:
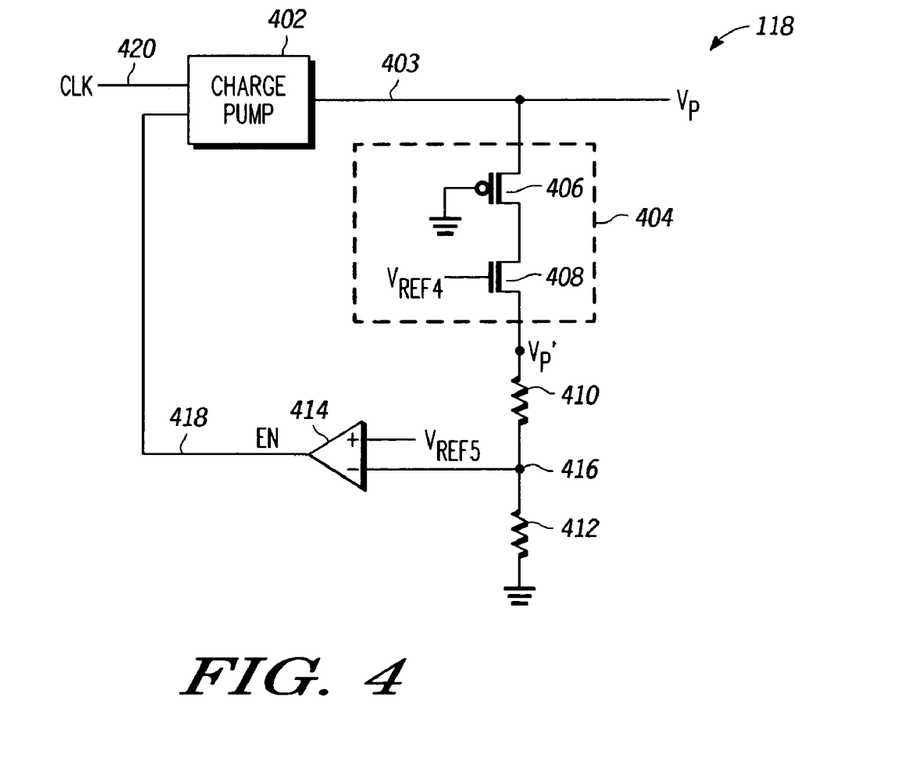
FIG. 4 is a diagram illustrating an exemplary current monitor of the program/verify system of FIG. 2 in accordance with at least one embodiment of the present disclosure.

Referring to FIG. 4, an exemplary implementation of the program voltage supply 118 is illustrated in accordance with at least one embodiment of the present disclosure. In the depicted example, the program voltage supply 118 includes a charge pump 402, emulation circuitry 404, resistors 410 and 412, and op-amp 414.

The emulation circuitry 404 includes an input connected to the program voltage bus 403 and an output. The emulation circuitry 404, in one embodiment, includes circuitry similar to the circuitry of the PSEL/MUX 120 (FIG. 1) that is in the current path between the program voltage bus 403 and the bit lines of the bit cell array 104 (FIG. 1) so as to emulate the voltage drop that occurs at the program PSEL/MUX 120. In the particular implementation of FIG. 4, the emulation circuitry 404 includes a p-channel transistor 406 and n-channel transistor 408. The p-channel transistor 406 includes a gate electrode connected to a low voltage reference (e.g., ground) when enabled, a first current electrode connected to the program voltage bus 403, and a second current electrode. The n-channel transistor 408 includes a first current electrode connected to the second current electrode of the p-channel transistor 406, a second current electrode, and a gate electrode to receive a voltage reference $V_{REF4}$, which represents the voltage (e.g., 8.5 V) supplied to the corresponding n-channel transistor of the PSEL/MUX 120 or PSEL/MUX 121 (FIG. 1) during operation. The resistor 410 includes a first electrode connected to the second current electrode of the n-channel transistor 408 and a second electrode connected to a node 416. The resistor 412 includes a first electrode connected to the node 416 and a second electrode connected to the low voltage reference. The op-amp 414 includes a first signal input to receive a voltage reference $V_{REF5}$, a second signal input connected to the node 416, and an output to provide an enable signal 418. The charge pump 402 includes an input to receive the enable signal 418, an input to receive a clock signal 420, and an output connected to the program voltage bus 403 to provide the program voltage $V_P$.

In operation, the charge pump 402 outputs a voltage for the program voltage $V_P$ onto the program voltage bus 403. The program voltage $V_P$ is input to the emulation circuitry 404, which outputs a voltage $V_{P'}$ (where $V_{P'}$ equals $V_P$ less the voltage drop of the emulation circuitry 404). The resistors 410 and 412 form a voltage divider for the node 416, and the voltage at the node 416 is compared with the voltage $V_{REF5}$. In at least one embodiment, the voltage $V_{REF5}$ is selected to target a sufficient voltage and may be based on the expected junction breakdown voltage of the floating gate transistor being programmed. Accordingly, when the voltage at the node 416 falls below the voltage $V_{REF5}$, the op-amp 414 asserts the enable signal 418, thereby causing the charge pump 402 to increase the program voltage $V_P$. Conversely, when the voltage at the node 416 increases above the voltage $V_{REF5}$, the op-amp 414 deasserts the enable signal 418, thereby causing the charge pump 402 to maintain the program voltage $V_P$ at its current level until the program voltage $V_P$ is pulled down by the load or by the resistors 410 and 412 via the emulation circuitry 404. Accordingly, by emulating the voltage drop caused by the PSEL/MUX 120 (FIG. 2), the program voltage supply 118 can compensate for parasitic IR drop in the PSEL/MUX circuitry and thereby provide the intended drain programming voltage for the bit cell.

Figure 5:
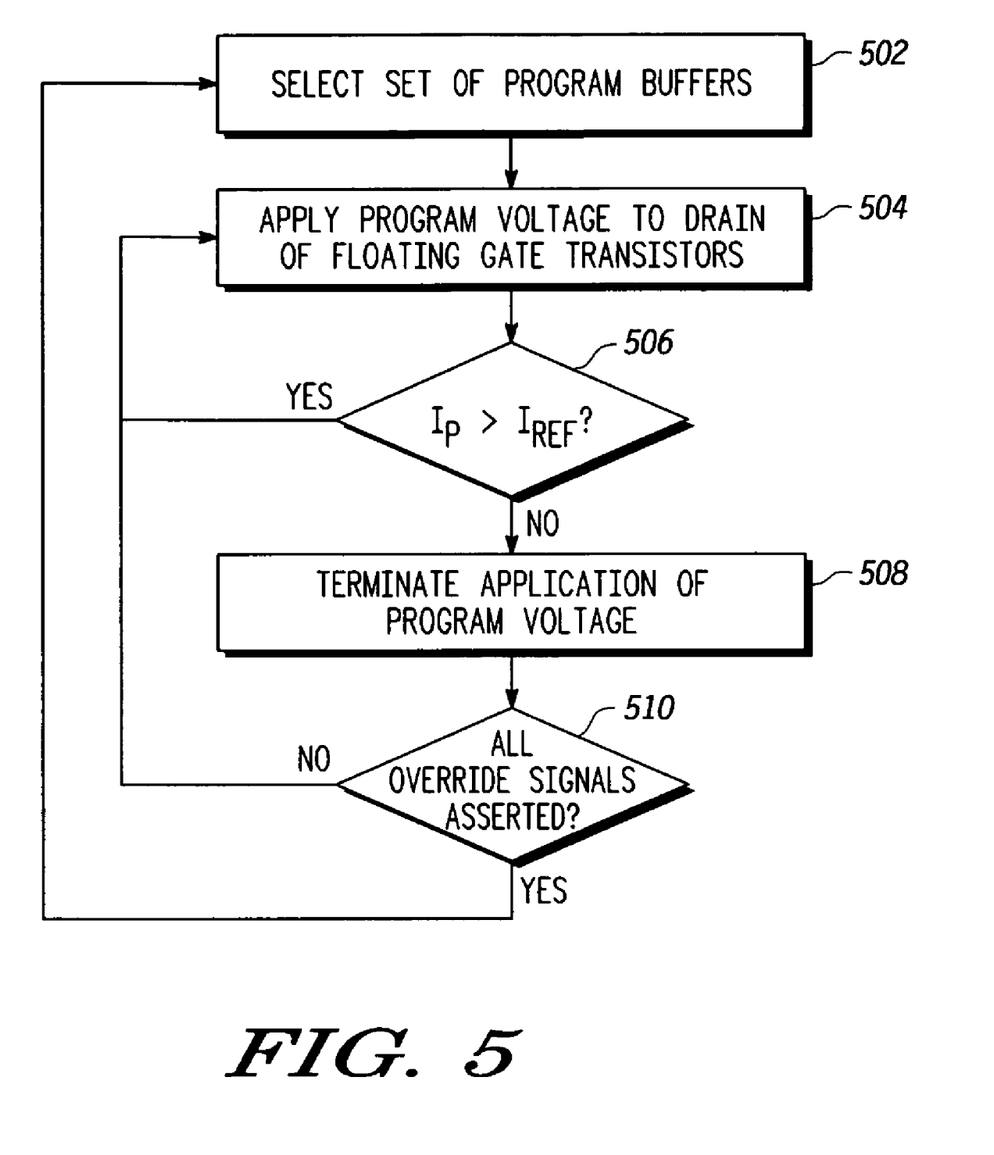
FIG. 5 is a flow diagram illustrating an exemplary method for the concurrent programming and program verification of a floating gate transistor of a bit cell in accordance with at least one embodiment of the present disclosure.

Referring to FIG. 5, an exemplary method 500 for concurrent programming and program verification is illustrated in accordance with at least one embodiment of the present disclosure. The method 500 includes receiving a data value to be programmed to a non-volatile memory and selecting a set of program buffers based on the data value for programming at block 502. At block 504, the method 500 includes applying a program voltage from the selected program buffers to the drain electrode of one or more corresponding floating gate transistors and applying another voltage to the control gate of the floating gate transistors via, e.g., corresponding row lines, so as to initiate a hot carrier injection process for the floating gates of the floating gate transistors. At block 506, the method 500 includes, for each bit cell array having a bit cell being programmed, generating a current $I_P$ based on the voltage at the source electrode of the floating gate transistor of the bit cell array to a reference current $I_{REF}$, where the reference current $I_{REF}$ represents the threshold current that indicates sufficient programming of the floating gate transistor of the bit cell array. While the current $I_P$ is greater than the reference current $I_{REF}$, the program voltage continues to be applied to the drain electrode of the floating gate transistor at block 504. Otherwise, once the current $I_P$ falls below the reference current $I_{REF}$, the floating gate transistor is presumed to be adequately programmed. Accordingly, at block 508, the application of the program voltage to the floating gate transistor being programmed is terminated and an override signal is asserted for the bit cell array. At block 510, the method 500 includes determining whether the override signals for all of the bit cell arrays are asserted. If all of the override signals are asserted, the next set of program buffers for the next set of bits to be programmed can be selected at block 502 and the process represented by blocks 504-510 can be repeated to program the next set of bit cells. Once all of the bits of the data value have been programmed into the non-volatile memory, the method 500 terminates.

The concurrent programming and program verification and the emulation of the voltage drop caused by the PSEL/MUX circuitry, as described herein, can provide a number of advantages. For one, programming time can be reduced due to the elimination of the need to repeat a sequential program/verify process, as well as by eliminating a separate verify step subsequent to programming. Further, the emulation of the voltage drop by the program voltage supply 118 permits a reduction in the layout size of the transistors of the PSEL/MUX 120, thereby allowing for a decreased memory pitch. As another advantage, the floating gate transistor can be programmed using a higher open circuit voltage and higher drain/source voltage, thereby increasing the hot carrier injection process efficiency. Additionally, by enabling the programming to terminate once the floating gate has been sufficiently charged with electrons, the long-term reliability of the floating gate transistor can be increased due to the reduced inherent field across the oxide between the control gate and the floating gate. Moreover, in multilevel bit cell implementations, tighter distributions between the different levels is facilitated by the precision allowed by the concurrent program and verify process.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. A method comprising:
applying a first program voltage to a drain electrode of a first floating gate transistor coupled to a first bit line of a non-volatile memory;
determining a first current based on a voltage at a source electrode of the first floating gate transistor concurrent with the application of the first program voltage to the drain electrode of the first floating gate transistor; and
terminating the application of the first program voltage to the drain electrode of the first floating gate transistor in response to determining the first current to be less than a threshold current.

2. The method of claim 1, further comprising:
applying a second program voltage to a drain electrode of a second floating gate transistor coupled to a second bit line of the non-volatile memory subsequent to terminating the application of the first program voltage;
determining a second current based on a voltage at a source electrode of the second floating gate transistor concurrent with the application of the second program voltage to the drain electrode of the second floating gate transistor; and
terminating the application of the second program voltage to the drain electrode of the second floating gate transistor in response to determining the second current to be less than the threshold current.

3. The method of claim 1, further comprising:
adjusting the first program voltage based on an expected voltage drop between a source of the first program voltage and the drain electrode of the first floating gate transistor.

4. The method of claim 3, wherein:
applying the first program voltage comprises generating the first program voltage using a charge pump; and
adjusting the first program voltage comprises:
determining a voltage drop across a circuit component that models a corresponding circuit component coupled between an output of the charge pump and the drain electrode of the first floating gate transistor; and
adjusting the first program voltage via the charge pump based on the voltage drop.

5. The method of claim 1, wherein determining the first current comprises:
determining a first voltage drop across a first resistive element coupled to the source electrode, wherein the first voltage drop is representative of the first current.

6. The method of claim 5, further comprising:
determining a second voltage drop across a second resistive element coupled to receive the threshold current, wherein the second voltage drop is representative of the threshold current; and
determining a relationship between the first current and the threshold current based on a comparison of the first voltage drop to the second voltage drop.

7. The method of claim 1, wherein:
the first current represents a threshold voltage of the first floating gate transistor;
the current threshold represents a predetermined threshold voltage; and
the predetermined threshold voltage represents a predetermined program state of the first floating gate transistor.

8. The method of claim 7, wherein the predetermined program state comprises a program state representative of a logic zero value.

9. In a non-volatile memory comprising a first bit line coupled to a drain electrode of a first floating gate transistor and a second bit line coupled to a drain electrode of a second floating gate transistor, a method comprising:
selecting the first bit line for programming;
continuously applying a first program voltage to the drain electrode of the first floating gate transistor until a first current based on a voltage of a source electrode of the first floating gate transistor is less than a threshold current;
selecting the second bit line for programming subsequent to applying the first program voltage to the drain electrode of the first floating gate transistor; and
continuously applying a second program voltage to the drain electrode of the second floating gate transistor until a second current based on a voltage of a source electrode of the second floating gate transistor is less than a second threshold current.

10. The method of claim 9, wherein:
the first current is representative of a threshold voltage of the first floating gate transistor;
the second current is representative of a threshold voltage of the second floating gate transistor; and
the current threshold is representative of a predetermined threshold voltage.

11. The method of claim 9, further comprising:
determining the first current based on a first voltage drop across a resistive element coupled to the source electrode of the first floating gate transistor; and
determining the second current based on a second voltage drop across a resistive element coupled to the source electrode of the second floating gate transistor.

12. The method of claim 9, wherein applying the first program voltage comprises adjusting the first program voltage based on an expected voltage drop between a source of the first program voltage and the drain electrode of the first floating gate transistor.

13. The method of claim 12, wherein applying the second program voltage comprises adjusting the second program voltage based on an expected voltage drop between the source of the first program voltage and the drain electrode of the second floating gate transistor.

14. The method of claim 9, wherein the first program voltage is equal to the second program voltage.

15. A non-volatile memory comprising:
a program voltage supply comprising an output to provide a program voltage;
a bit cell array comprising a first bit line and a first floating gate transistor having a drain electrode coupled to the first bit line;
a program select module configured to couple the first bit line to the output of the program voltage supply in a first state and to decouple the first bit line from the output of the program voltage supply in a second state; and
a program verify module comprising an input coupled to a source electrode of the first floating gate transistor and an output configured to adjust the program select module between the first state and the second state in response to a first current based on a voltage at the source electrode.

16. The non-volatile memory of claim 15, wherein the program voltage supply comprises:
an emulation circuit having an input coupled to the output of the program voltage supply, wherein the emulation circuit is configured to emulate a corresponding circuit of the program select module that is coupled between the output of the program voltage supply and the drain electrode of the first floating gate transistor; and
means for adjusting the program voltage based on a voltage drop across the emulation circuit.

17. The non-volatile memory of claim 15, wherein the program verify module comprises:
a first resistive element coupled to the source electrode of the first floating gate transistor;
a second resistive element to receive a reference voltage, wherein the reference voltage is representative of the threshold current; and
a comparator to selectively adjusting the program select module between the first state and the second state based on a comparison of a first voltage drop across the first resistive element and a second voltage drop across the second resistive element.

18. The non-volatile memory of claim 15, wherein:
the bit cell array comprises a second bit line and a second floating gate transistor having a drain electrode coupled to the second bit line;
the program select module is configured to couple the second bit line to the output of the program voltage supply in the second state and to decouple the second bit line from the output of the program voltage supply in the first state; and
the program verify module comprises an input coupled to a source electrode of the second floating gate transistor and an output to selectively disable the program select module in response to a second current based on a voltage at the source electrode of the second floating gate transistor.

19. The non-volatile memory of claim 15, wherein the non-volatile memory is a flash memory.

* * * * *